(12) United States Patent
Laurent et al.

(10) Patent No.: US 6,240,026 B1
(45) Date of Patent: May 29, 2001

(54) BIT LINE SENSE CIRCUIT AND METHOD FOR DYNAMIC RANDOM ACCESS MEMORIES

(75) Inventors: Duane Giles Laurent, Lewisville; Elmer Henry Guritz; James Leon Worley, both of Flower Mound, all of TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/519,714

(22) Filed: Mar. 7, 2000

(51) Int. Cl.[7] ............................................. G11C 7/00

(52) U.S. Cl. ................. 365/189.11; 365/149; 365/191; 365/203

(58) Field of Search ............................. 365/189.11, 149, 365/189.01, 191, 203

(56) References Cited

U.S. PATENT DOCUMENTS

| 5,510,749 | * | 4/1996 | Arimoto | 327/546 |
| 6,009,023 | * | 12/1999 | Lu et al. | 365/189.11 |
| 6,018,177 | * | 1/2000 | Chi | 257/303 |

* cited by examiner

*Primary Examiner*—David Nelms
*Assistant Examiner*—Hoai V. Ho
(74) *Attorney, Agent, or Firm*—Theodore E. Galanthay; Lisa K. Jorgenson; Andre Szuwalski

(57) ABSTRACT

A circuit and method are disclosed for controlling bootstrap circuitry that boosts a voltage level appearing on word lines of a dynamic random access memory device. During execution of a memory access operation, the circuit is adapted to enable the bootstrap circuitry a period of time following the memory device's sense amplifiers initially powering up. The circuit senses when the voltage appearing on a select bit line crosses a predetermined voltage level, and enables the bootstrap circuitry thereafter. In this way, a period of time elapses between the sense amplifiers turning on and the activation of the bootstrap circuitry, thereby reducing noise introduced from the sense amplifiers turning on from impacting the operation of the bootstrap circuitry.

31 Claims, 4 Drawing Sheets

BIT LINE SENSE CIRCUIT AND METHOD FOR DYNAMIC RANDOM ACCESS MEMORIES

BACKGROUND OF THE INVENTION

1. Technical Field of the Invention

The present invention relates to a circuit and method for triggering control circuitry in a memory device, and particularly to a sense circuit and method for enabling boost circuitry of the memory device based upon the activity of sense amplifiers thereof.

2. Background of the Invention

Today's dynamic random access memory (DRAM) devices typically include at least one memory cell array organized in rows and columns of capacitive-storage memory cells, with each row of memory cells being connected to a distinct word line and each column of memory cells being connected to a distinct bit line. Address decode circuitry is included to select a word line based upon the value of the address provided to the DRAM device. A distinct sense amplifier is connected to each pair of bit lines and amplifies the differential voltage placed thereon from accessing a row of memory cells.

In executing a memory access operation, such as a read, write or refresh operation, a word line is selected and driven to the power supply voltage value, Vdd, so that the contents of the memory cells in the selected row of memory cells are placed upon the bit lines of the DRAM device. When the sense amplifiers are powered up and connected to the bit lines, boost circuitry is enabled to capacitively boost the selected word line to a boosted voltage in excess of the power supply voltage value. With the voltage on the selected word line being at the boosted voltage, a charge corresponding to the power supply voltage may be capacitively stored in a memory cell in the selected row to refresh the contents of the memory cell. Storing a charge corresponding to the power supply voltage, as opposed to a charge corresponding to a lesser voltage value as would occur without boost circuitry, advantageously lengthens the amount of time until the capacitive memory cell needs to be refreshed.

During a memory access operation, any line that can capacitively couple to the selected word line can conceivably change the voltage and/or charge appearing thereon. This may undesirably alter the value of the boosted voltage to which the selected word line is to be later capacitively boosted.

Sense amplifiers are typically powered up and/or connected to high reference voltage level Vdd and low reference voltage level Vss during a memory access operation and particularly immediately following the selected row of memory cells being connected to the bit lines. Because the number of sense amplifiers that are simultaneously powered up and/or turned on may exceed one thousand, an appreciable amount of noise, in the form of a voltage spike or pulse, is typically generated by powering the sense amplifiers. The extent of the noise generated from powering the sense amplifiers has been seen to substantially effect the ability of the boost circuitry to boost the voltage appearing on the selected word line to the desired voltage level.

Based upon the foregoing, there is a need for a circuit and method for reducing the effects of noise on the operation of a DRAM device and particularly the operation of the boost circuitry thereof.

SUMMARY OF THE INVENTION

The present invention overcomes the shortcomings in prior DRAM devices and satisfies a significant need for a DRAM device which substantially reduces the amount of noise in boosting word lines of a DRAM device during a memory access operation. The DRAM device includes an array of memory cells arranged in a plurality of rows and columns of memory cells, with each row of memory cells being coupled to a distinct word line and each column of memory cells being coupled to a distinct bit line. A sense amplifier is coupled to each bit line pair for sensing a voltage differential appearing across the bit line pair (due to providing the contents from the memory cells in a selected row on the bit lines) and driving the bit lines towards reference levels Vss and Vdd accordingly. Equilibration circuitry precharges and equalizes the voltages across the bit lines of each bit line pair to an intermediate voltage level.

The DRAM device further includes a boost circuit for boosting a voltage appearing on a selected word line to a boosted voltage outside of the power supply range. The present DRAM device further includes a sense circuit connected to a bit line that is associated with a column of unused memory cells, such as memory cells appearing along the border of the memory cell array. The sense circuit triggers or enables the boost circuit to drive the selected word line to the boosted voltage after the sense amplifiers have finished detecting the voltage differential across each bit line pair. The self-timed sense circuit enables the boost circuit upon a voltage appearing on the associated bit line crossing a predetermined voltage level.

During a memory access operation, such as a memory read, write or refresh operation, the bit lines are initially precharged and equalized at the intermediate voltage level by the equilibration circuitry. The addressed or selected word line is then driven to a voltage level to connect the selected row of memory cells to the bit lines. At this point, the contents of the selected row of memory cells are placed on the bit lines so as to cause a voltage differential between the bit lines of each bit line pair. The sense amplifiers are then powered or enabled and sense the voltage differential appearing across the bit lines of each bit line pair and accordingly drive the bit lines towards the reference voltage levels, Vss and Vdd. As the voltage appearing on the bit line to which the sense circuit is connected crosses the predetermined voltage level, such as a voltage level between the intermediate voltage level and high reference voltage Vdd, the sense circuit asserts a signal to enable the boost circuit. The predetermined voltage level is a voltage level that ensures that a period of time has elapsed from the time the sense amplifiers are initially powered so that noise generated thereby is no longer present. The enabled boost circuit boosts the voltage level of the selected word line beyond a reference voltage level, such as to a voltage level greater than Vdd, so that a memory cell in the selected row is capable of storing a charge associated with either reference voltage level, Vss or Vdd, therein. By waiting a period of time following the sense amplifiers being initially powered to boost the selected word line, the selected word line is boosted to the desired boosted voltage level.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown. The preferred embodiment is provided so that this disclosure will be thorough and complete, and will fully convey the scope of the invention to those skilled in the art.

Figure 1:
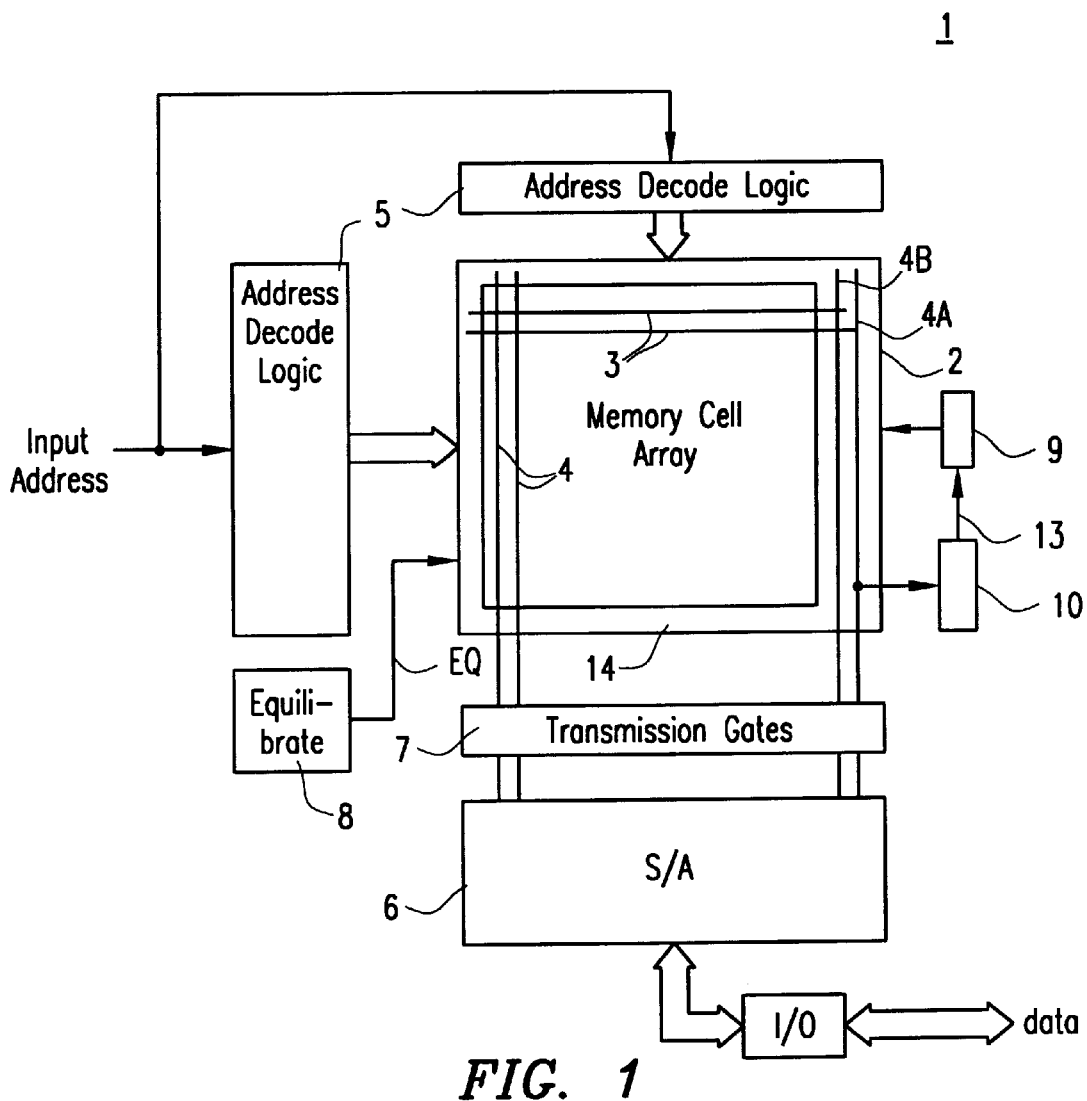
FIG. 1 is a block diagram of a dynamic random access memory device according to a preferred embodiment of the present invention.
Figure 2:
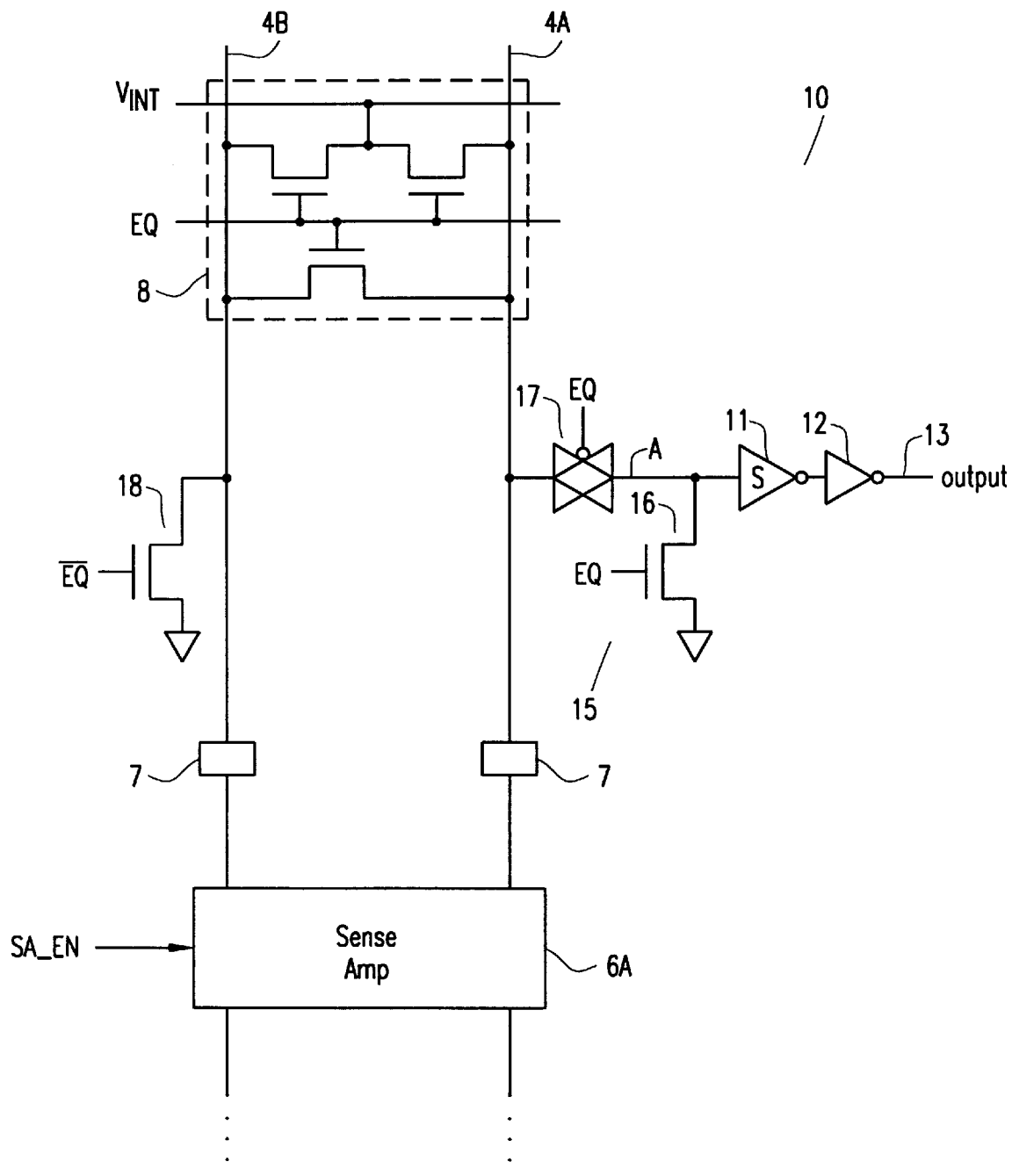
FIG. 2 is a circuit diagram illustrating a sense circuit for the dynamic random access memory of FIG. 1.

Referring to FIGS. 1–2, there is shown a dynamic random access memory (DRAM) device 1 according to a preferred embodiment of the present invention. The DRAM device 1 includes one or more arrays 2 of memory cells, each array 2 arranged as a plurality of rows and columns of memory cells. Each row of memory cells is connected to a distinct word line 3 and each column of memory cells is connected to a distinct bit line 4. Address decode logic 5 selects a word line 3 according to the address input value provided to DRAM device 1. In an exemplary preferred embodiment of the present invention, address decode logic 5 drives the selected word line 3 to a high reference voltage level (Vdd) to connect the associated row of memory cells to bit lines 4.

Sense amplifiers 6 are coupled to bit lines 4 via transmission gates 7. Each sense amplifier is coupled to a distinct pair of bit lines. When connected to a bit line pair, each sense amplifier senses a voltage differential appearing across the bit line pair connected thereto and drives the bit lines to the high reference voltage level (Vdd) and the low reference voltage level (Vss) accordingly. In particular, a sense amplifier drives a first bit line of the bit line pair connected thereto to Vdd and a second bit line to Vss depending upon the polarity of the voltage differential appearing across the bit lines. Sense amplifiers 6 are selectively connected to high reference voltage level Vdd and low reference voltage level Vss (not shown) so that sense amplifiers 6 are powered up during the course of a memory access operation.

The DRAM device 1 further comprises equilibration circuitry 8 which, prior to the connection of sense amplifiers 6 to a selected row of memory cells, shorts together bit lines 4 of each bit line pair and connects the bit lines to an intermediate voltage level Vint. Equilibration allows for the above-mentioned voltage differential appearing across a pair of bit lines to accurately correspond to data in the memory cell connected to the bit line pair. Equilibration circuitry 8 includes, among other things, control circuitry for generating equilibration signal EQ (as shown in FIG. 1) and circuitry for shorting together bit lines 4 of each bit line pair upon the assertion of equilibration signal EQ (as shown in FIG. 2).

The DRAM device 1 further includes boost circuitry 9 which, during the execution of a memory access operation, drives the selected word line 3 to a boosted voltage level (generally at least a transistor threshold voltage greater than Vdd). Consequently, a memory cell in the selected row of memory cells may store a charge corresponding to either the high reference voltage level (Vdd) or the low reference voltage level (Vss), thereby reducing the need to later refresh the memory cells. Boost circuitry 9 may be a bootstrap circuit which capacitively boosts the selected word line to the desired boosted voltage level.

In order to reduce the likelihood of the voltage appearing on the selected word line 3 being changed due to noise caused by the powering of sense amplifiers 6 during a memory access operation, DRAM device 1 includes a sense circuit 10 which enables boost circuitry 9 a period of time following the time sense amplifiers 6 are initially powered up. By delaying the time the boost circuitry 9 boosts the selected word line 3 to the boosted voltage, the voltage appearing on the selected word line 3 is substantially unaffected by sense amplifiers 6 being powered.

In particular, sense circuit 10 is self-timed to enable and/or trigger boost circuitry 9 following the occurrence of an event. According to a preferred embodiment of the present invention, sense circuit 10 enables boost circuitry 9 upon a select bit line 4A crossing a predetermined voltage level Vp following sense amplifiers 6 being powered and driving bit lines 4. Sense circuit 10 senses the voltage appearing on select bit line 4A crossing the predetermined voltage level Vp and asserts an enable signal that drives an enable input signal of boost circuitry 9. Noting that bit lines 4 are precharged to the intermediate voltage level Vint and are only slightly modified therefrom following the selected row of memory cells being connected to bit lines 4, the predetermined voltage level Vp is a voltage level between intermediate voltage level Vint and either the high reference voltage level Vdd or the low reference voltage level Vss. Predetermined voltage level Vp is chosen to be between the intermediate voltage level Vint and high reference voltage level Vdd for exemplary purposes only.

Accordingly, sense circuit 10 includes a Schmitt trigger circuit 11 (FIG. 2) having a high trip point Vtph set to predetermined voltage level Vp and a low trip point Vtpl to a predetermined voltage less than intermediate voltage Vint but greater than low reference voltage level Vss. In this way, the output of Schmitt trigger circuit 11 is driven to a low logic level when the voltage appearing on bit line 4A exceeds high trip point Vtph and thereafter remains above low trip point Vtpl, and a high logic level when the voltage on select bit line 4A crosses low trip point Vtpl and thereafter remains below high trip point Vtph. Logic inverter 12 performs a logic inversion of the output of Schmitt trigger circuit 11 and drives the enable input of boost circuit 9.

As stated above, sense circuit 10 senses the voltage level appearing on select bit line 4A and enables boost circuitry 9 based upon the sensed voltage level. Select bit line 4A combines with select bit line 4B to form a select bit line pair. According to the preferred embodiment of the present invention, select bit lines 4A and 4B are coupled to a row of unused memory cells. In other words, the memory cells to which select bit lines 4A and 4B are coupled are not used by DRAM device 1 to store data. In this way, select bit lines 4A and 4B may be manipulated so that the relative voltages thereof cause sense circuit 10 to enable boost circuitry 9 during each memory access operation, as explained below.

For reasons of uniformity, existing DRAM devices typically include a ring 14 of unused memory cells within each memory cell array 2 that serves as a border for memory cells that are used for data storage. According to a preferred embodiment of the present invention, select bit lines 4A and 4B extend along and are coupled to a column of unused memory cells in the ring 14 of unused memory cells. In this way, select bit lines 4A and 4B and the columns of memory cells associated therewith occupy substantially little if any additional silicon space.

Sense circuit 10 further includes a reset circuit 15 for resetting Schmitt trigger circuit 11 so as to disable boost circuit 9 at the start of a memory access operation. As shown in FIG. 2, reset circuit 15 includes an n-channel pull-down MOS transistor 16 having a drain terminal connected to the input of Schmitt trigger circuit 11 and a source terminal connected to low reference voltage level Vss. A control terminal of transistor 16 is connected to equilibrate signal EQ that is asserted by equilibrate circuit 8 when bit lines 4 are initially equilibrated and precharged, so as to activate transistor 16. As a result, the input of Schmitt trigger circuit 11 is connected to low reference voltage level Vss during equilibration so the output 13 of sense circuit 10 is initially driven to low reference voltage level Vss.

It is understood that transistor 16 may be a pull-up transistor having a drain terminal connected to high reference voltage level Vdd and a source terminal connected to the input of Schmitt trigger circuit 11. In this scenario, an even number of logic inverters 12 may be series connected to the output of Schmitt trigger circuit 11 to maintain the active high polarity of output 13 of sense circuit 13.

Because, during equilibration, select bit lines 4A and 4B are precharged to intermediate voltage level Vint while transistor 16 pulls the input of Schmitt trigger circuit 11 to low reference voltage level Vss, reset circuit 15 includes transmission gate 17 connected between the input of Schmitt trigger circuit 11 and select bit line 4A and is adapted to be turned off during equilibration. As shown in FIG. 2, the control terminal of transmission gate 17 is tied to equilibrate control signal EQ.

As stated above, the voltage signals appearing on select bit lines 4A and 4B are adapted to substantially emulate the signal appearing on bit lines 4 that are coupled to columns of memory cells that are used for data storage. Because select bit lines 4A and 4B are connected to unused memory cells that do not provide any voltage differential between select bit lines 4A and 4B when connected thereto, sense circuit 10 includes an n-channel MOS transistor 18 for creating a voltage differential between select bit lines 4A and 4B. Transistor 18 may be configured as a pull-down transistor, having a drain terminal connected to select bit line 4B and a control terminal connected to the logical inverse of equilibration control signal EQ. Transistor 18 is preferably sized and dimensioned to weakly pull select bit line 4B to low reference voltage level Vss following the equilibration of bit lines 4. In this way, transistor 18 creates a voltage differential between select bit lines 4A and 4B having the desired polarity so that when sense amplifier 6A is connected to select bit lines 4A and 4B following equilibration, sense amplifier 6A senses the voltage differential and drives select bit line 4A towards the high reference voltage level Vdd.

It is understood that, in the alternative, transistor 18 may be configured as a pull-up transistor connected to select bit line 4A (not shown).

Figure 3:
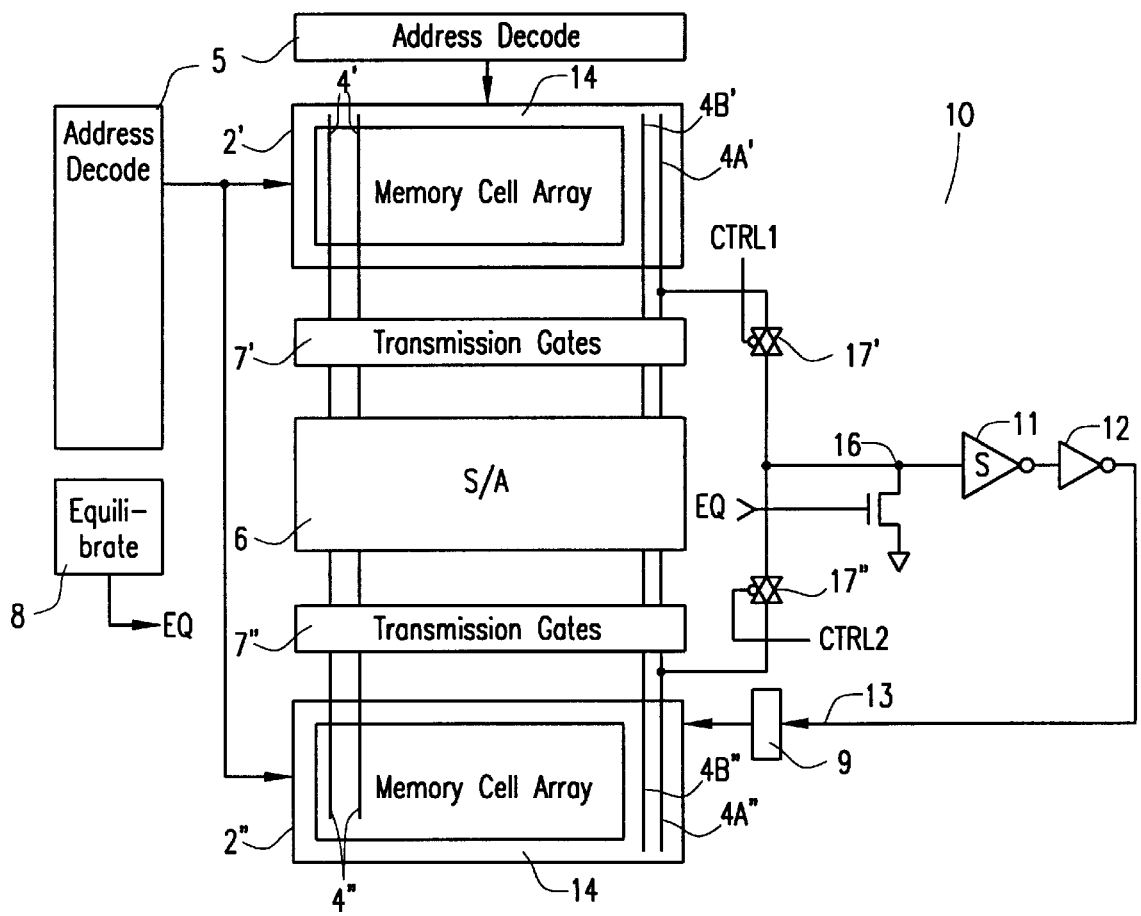
FIG. 3 is a block diagram of a dynamic random access memory device according to a second preferred embodiment of the present invention.

In the event sense amplifiers 6 are coupled to two memory cell arrays 2' and 2" (FIG. 3) and transmission gates 7' and 7" connect only the appropriate memory cell array 2' or 2" to sense amplifiers 6 during a memory access operation, memory cell arrays 2' and 2" respectively include a pair of select bit lines 4A'–4B' and 4A"–4B" that are connected to unused memory cells. In this memory scheme, transmission gates 17' and 17" are respectively connected to select bit lines 4A' and 4A". In addition, only a single transistor 16, Schmitt trigger circuit 11 and logic inverter 12 are needed by connecting together of the output terminal of transmission gates 17' and 17". The control terminals of transmission gates 17' and 17" are respectively connected to control signals CTRL1 and CTRL2, each of which is derived from equilibration control signal EQ. In this way, transmission gates 17' and 17" form a multiplexer circuit that selects as an input to Schmitt trigger circuit 11 the select bit line 4A' or 4A" according to which memory cell array is being accessed.

It is understood that DRAM device 1 may include additional circuitry, such as read/write circuitry and various control circuitry, that is utilized in performing memory access operations. Such additional circuitry, however, is not shown for reasons of clarity.

Figure 4:
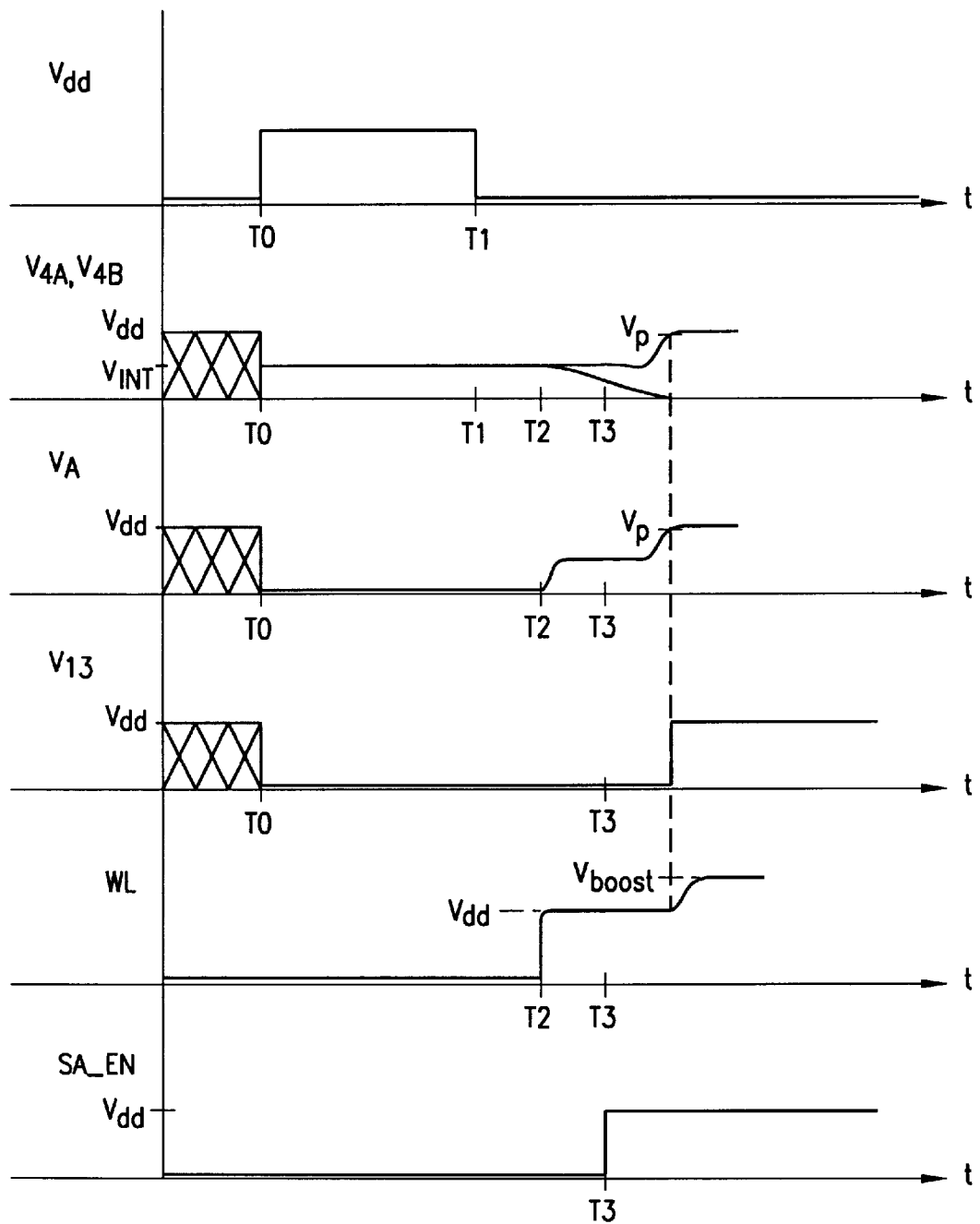
FIG. 4 is a waveform diagram illustrating an operation of the dynamic random access memory device of FIGS. 1 and 3.

The operation of DRAM device 1 according to the present invention will be described below with reference to FIG. 4. In response to a request for a memory access operation, bit lines 4 are equilibrated and control signal EQ is asserted at time t0. Select bit lines 4A and 4B are precharged to intermediate voltage level Vint soon after time t0. In addition, node A (the input to Schmitt trigger circuit 11) is pulled down to low reference voltage level Vss due to transistor 16 being turned on. With node A being below the low trip point Vtpl thereof, the output of Schmitt trigger circuit 11 is driven to the high reference voltage level Vdd which causes the output 13 of sense circuit 10 to be driven to the low reference voltage level Vss. Transmission gate 17 and transistor 18 are turned off at this time.

Equilibration ends with equilibration control signal EQ being de-asserted at time t1. At this time, select bit lines 4A and 4B are no longer shorted together and coupled to intermediate voltage level Vint. Transistor 18 is turned on so as to weakly pull select bit line 4B towards the low reference voltage level Vss. Transmission gate 17 is turned on so as to short node A to select bit line 4A, and transistor 16 is turned off. This results in the voltage appearing on select bit line 4A dropping slightly. Transistor 18 pulling select bit line 4B towards low reference voltage level Vss produces a slight charge differential between select bit line 4B and select bit line 4A. Schmitt trigger circuit 11 does not change state at this time. Consequently, output 13 of sense circuit 10 remains at the low reference voltage level Vss.

The selected word line WL is driven to the high reference voltage level Vdd at time t2. The contents of each memory cell in the selected row of memory cells creates a voltage differential between the bit lines 4 of the associated bit line pair at this time. Next, sense amplifiers 6 are powered at time t3 by connecting high reference voltage level Vdd and low reference voltage level Vss thereto. FIG. 4 shows control signal SA_EN being asserted at time t3 so as to power sense amplifiers 6. It is understood that, alternatively, two control signals may be used to power up sense amplifiers 6, and that a single control signal SA_EN is utilized for exemplary purposes only.

With each sense amplifier 6 being powered and sensing the voltage differential appearing across the bit line pair associated therewith, bit lines 4 are driven to the appropriate reference voltage level (Vss or Vdd) based upon the polarity of the corresponding voltage differential. In particular, sense amplifier 6 senses the voltage differential across select bit lines 4A and 4B, with the voltage of select bit line 4A being greater than the voltage of select bit line 4B, and drives select bit line 4A towards high reference voltage level Vdd. Schmitt trigger circuit 11 changes state and drives a low reference voltage signal at the output thereof as the voltage appearing on select bit line 4A crosses the high trip point voltage Vtph of Schmitt trigger circuit 11. The change in state of Schmitt trigger circuit 11 causes output 13 of sense circuit 10 to be asserted, which thereupon enables boost circuit 9 so that the voltage appearing on the selected word line WL is capacitively boosted to boost voltage Vboost. At this point, a high reference voltage level Vdd may be successfully placed within a memory cell of the selected row of memory cells, assuming boost voltage Vboost is at least a threshold voltage greater than Vdd. Selected word line WL being driven to the low reference voltage level Vss completes the memory access operation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A dynamic random access memory, comprising:

an array of memory cells arranged in a plurality of rows and columns of memory cells, including a plurality of word lines with each row of memory cells being connected to a distinct word line and a plurality of bit lines with each column of memory cells being connected to a distinct bit line;

a plurality of sense amplifiers, each sense amplifier being coupled to a pair of bit lines;

address decode circuitry, having a plurality of inputs coupled to address inputs of the dynamic random access memory device and a plurality of outputs coupled to the word lines, for selecting a word line based upon the value of address inputs of the dynamic random access memory device;

boost circuitry for selectively boosting a voltage on a word line selected by the address decode circuitry during at least a portion of a memory access operation;

detection circuitry for activating the boost circuitry following the sense amplifiers driving the bit line pairs during a memory operation, the detecting circuitry being triggered to activate the boost circuitry based upon a voltage level of a first bit line of a bit line pair crossing a predetermined voltage level.

2. The dynamic random access memory of claim 1, wherein:

an input of the detection circuitry is coupled to the first bit line.

3. The dynamic random access memory of claim 2, wherein:

the first bit line is coupled to a column of unused memory cells in the memory cell array.

4. The dynamic random access memory of claim 2, further comprising:

equilibration circuitry for equalizing the bit lines to a predetermined intermediate voltage level during the memory access operation;

wherein the detection circuitry comprises a Schmitt trigger circuit having a high level trip point that is greater than the predetermined intermediate voltage level and a low level trip point that is less than the predetermined intermediate voltage level, an output of the Schmitt trigger circuit being coupled to an input of the boost circuitry.

5. The dynamic random access memory of claim 4, further comprising:

a transmission gate connected between the Schmitt trigger circuit and the first bit line.

6. The dynamic random access memory of claim 5, wherein:

the equilibration circuitry asserts an equilibrate signal during the memory access operation for equalizing bit lines of the bit line pairs; and a control terminal of the transmission gate is connected to the equilibrate signal so as to be disabled when the equilibrate signal is asserted.

7. The dynamic random access memory of claim 6, further comprising:

a pull-down device coupled to the input of the Schmitt trigger circuit and enabled by the equilibrate signal when asserted.

8. The dynamic random access memory of claim 4, wherein:

the detection circuitry further comprises a device, connected to a bit line of the bit line pair to which the Schmitt trigger circuit is coupled, for providing a voltage differential therebetween.

9. The dynamic random access memory of claim 8, wherein:

the equilibration circuitry asserts an equilibrate signal during the memory access operation for equalizing the bit lines; and the device comprises a transistor having a source/drain terminal connected to a bit line of the bit line pair to which the Schmitt is coupled, and a control terminal coupled to the equilibration signal so as to be turned off when the equilibration signal is asserted.

10. A method of performing a memory access operation for a dynamic random access memory device having a plurality of memory cells arranged in a plurality of rows and columns, with each memory cell in a row being coupled to the same word line and each memory cell in a column being coupled to the same bit line, and a plurality of sense amplifiers with each sense amplifier being coupled to a distinct pair of bit lines, the method comprising the steps of:

equilibrating the bit lines to a predetermined intermediate voltage level;

driving a selected word line to a reference voltage level to connect a corresponding row of memory cells to the bit lines;

enabling the sense amplifiers and connecting each sense amplifier to a respective pair of bit lines;

detecting a voltage on a bit line of a particular bit line pair crossing a predetermined voltage level distinct from the intermediate voltage level, following the step of enabling; and boosting the selected word line to a voltage level greater than the reference voltage level upon an affirmative detection of the voltage appearing on the bit line of the particular bit line pair has crossed the predetermined voltage level.

11. The method of claim 10, wherein:

the particular bit line pair is connected to at least one column of unused memory cells in the dynamic random access memory device.

12. The method of claim 10, further comprising the step of:

creating a voltage differential between bit lines of the particular bit line pair prior to the step of enabling.

13. The method of claim 12, wherein:

the voltage differential between the bit lines of the particular bit line pair has a predetermined polarity to cause the corresponding sense amplifier to drive the bit line whose voltage is detected during the step of detecting towards the desired reference voltage.

14. The method of claim 10, further comprising the step of:
  selecting, prior to the step of detecting, the particular bit line pair from a plurality of bit line pairs.

15. The method of claim 10, wherein:
  the dynamic random access memory device includes a circuit for boosting the voltage level on the selected word line above the power supply voltage level;
  the step of boosting comprises enabling the circuit for boosting; and
  the method further comprises the step of disabling the boost circuit during the step of equilibrating.

16. A dynamic random access memory, comprising:
  a memory cell array arranged in a plurality of rows and columns of memory cells, including a plurality of word lines with each row of memory cells being connected to a distinct word line and a plurality of bit lines with each column of memory cells being connected to a distinct bit line;
  address decode circuitry for selecting a word line to be driven to a reference voltage level to connect a row of memory cells to the bit lines;
  a plurality of sense amplifiers, each sense amplifier being coupled to a distinct pair of bit lines, the sense amplifiers being selectively powered;
  bootstrap circuitry for selectively driving the selected word line to a boosted voltage level greater than the reference voltage level during a portion of a memory operation; and
  sense circuitry for triggering the bootstrap circuitry to drive the selected word line to the boosted voltage level a predetermined period of time following the sense amplifiers being initially powered during a memory operation.

17. The dynamic random access memory of claim 16, wherein:
  the memory operation comprises a memory access operation.

18. The dynamic random access memory of claim 16, wherein:
  the predetermined period of time corresponds to a period from the time the sense amplifiers are initially powered to the time a bit line changes in voltage a predetermined voltage amount.

19. A dynamic random access memory, comprising:
  a memory cell array arranged in a plurality of rows and columns of memory cells, including a plurality of word lines with each row of memory cells being connected to a distinct word line and a plurality of bit lines with each column of memory cells being connected to a distinct bit line;
  address decode circuitry for selecting a word line to be driven to a reference voltage level to connect a row of memory cells to the bit lines;
  a plurality of sense amplifiers, each sense amplifier being coupled to a distinct pair of bit lines, the sense amplifiers being selectively powered;
  bootstrap circuitry for selectively driving the selected word line to a boosted voltage level greater than the reference voltage level during a portion of a memory operation; and
  sense circuitry for triggering the bootstrap circuitry to drive the selected word line to the boosted voltage level a predetermined period of time following the sense amplifiers being initially powered during a memory operation, the sense circuitry is coupled to a bit line of a bit line pair and triggers the bootstrap circuitry upon a voltage appearing on the bit line of the bit line pair crossing a predetermined voltage level following the sense amplifiers being initially powered during the memory operation.

20. The dynamic random access memory of claim 19, wherein:
  the bit line pair to which the sense circuitry is coupled is also coupled to at least one column of unused memory cells in the memory cell array.

21. The dynamic random access memory of claim 19, wherein:
  the sense circuitry comprises a Schmitt trigger circuit selectively coupled to the bit line of the bit line pair, a trip point of the Schmitt trigger circuit being at the predetermined voltage level.

22. The dynamic random access memory of claim 21, wherein:
  the bit line pair to which the sense circuit is coupled is coupled to at least one column of unused memory cells in the memory cell array;
  the sense circuitry further comprises a circuit connected to the bit line pair to which the sense circuit is coupled, for creating a voltage differential between the bit lines thereof prior to the sense amplifier associated therewith being powered.

23. The dynamic random access memory of claim 22, wherein:
  the circuit for creating a voltage differential comprises a transistor that is initially activated, during the memory operation, prior to the associated sense amplifier being powered and having a source/drain terminal connected to a bit line of the bit line pair to which the sense circuitry is coupled.

24. The dynamic random access memory of claim 21, wherein:
  the sense circuitry further comprises a transmission gate transistor connected between an input of the Schmitt trigger circuit and the bit line coupled thereto.

25. The dynamic random access memory of claim 24, wherein:
  the transmission gate transistor is enabled approximately when the associated sense amplifier is powered.

26. The dynamic random access memory of claim 24, wherein:
  the sense circuitry further comprises a transistor having a source/drain terminal connected to an input of the Schmitt trigger circuit and being activated prior to activation of the transmission gate transistor in order to maintain the Schmitt trigger circuit in a predetermined state prior to the associated sense amplifier being powered.

27. The dynamic random access memory of claim 19, wherein:
  the memory operation comprises a memory access operation.

28. The dynamic random access memory of claim 19, wherein:
  the memory operation comprises a memory read operation.

29. A method of performing a memory access operation for a dynamic random access memory device having a plurality of memory cells arranged in a plurality of rows and columns, with each memory cell in a row being coupled to the same word line and each memory cell in a column being coupled to the same bit line, and a plurality of sense amplifiers with each sense amplifier being coupled to a distinct pair of bit lines, the method comprising the steps of:

equilibrating the bit lines to a predetermined intermediate voltage level;

driving a selected word line to a reference voltage level to connect a corresponding row of memory cells to the bit lines;

powering the sense amplifiers and connecting each sense amplifier to a respective pair of bit lines; and boosting the selected word line to a voltage level greater than the reference voltage level following the sense amplifiers being initially powered.

30. The method of claim 29, wherein:

the boosting of the selected word line occurs a period of time following the sense amplifiers being initially powered.

31. The method of claim 30, wherein:

the period of time corresponds to a period from the time the sense amplifiers are initially powered to the time a bit line changes in voltage a predetermined voltage amount relative to the predetermined intermediate voltage level.

* * * * *